(12) United States Patent
Wang et al.

(10) Patent No.: US 11,074,884 B1
(45) Date of Patent: Jul. 27, 2021

(54) CONTROL CIRCUIT AND DISPLAY PANEL APPLIED BY CONTROL CIRCUIT

(71) Applicant: TCL CHINA STAR OPTOELECTRONICS TECHNOLOGY CO., LTD., Shenzhen (CN)

(72) Inventors: Tianhong Wang, Shenzhen (CN); Suping Xi, Shenzhen (CN)

(*) Notice: Subject to any disclaimer, the term of this patent is extended or adjusted under 35 U.S.C. 154(b) by 103 days.

(21) Appl. No.: 16/627,298

(22) PCT Filed: Dec. 16, 2019

(86) PCT No.: PCT/CN2019/125601
§ 371 (c)(1),
(2) Date: Dec. 29, 2019

(87) PCT Pub. No.: WO2021/056856
PCT Pub. Date: Apr. 1, 2021

(30) Foreign Application Priority Data

Sep. 24, 2019 (CN) .......................... 201910904131.5

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0286* (2013.01); *G09G 2310/08* (2013.01)

(58) Field of Classification Search
CPC ......... G09G 3/3677; G09G 2310/0286; G09G 2310/08; G11C 19/28
See application file for complete search history.

(56) References Cited

U.S. PATENT DOCUMENTS

| 10,008,146 | B2* | 6/2018 | Guo ...................... G09G 3/2092 |
| 10,008,154 | B2* | 6/2018 | Li ........................... G11C 19/28 |
| 10,008,155 | B2* | 6/2018 | Byun .................... G09G 3/3266 |
| 2015/0070259 | A1 | 3/2015 | Yamashita |

FOREIGN PATENT DOCUMENTS

| CN | 107068080 A | 8/2017 |
| CN | 107492361 A | 12/2017 |
| CN | 108766374 A | 11/2018 |

* cited by examiner

*Primary Examiner* — Sejoon Ahn

(57) ABSTRACT

A control circuit and a display panel applied by the control circuit are provided. The control circuit includes a plurality of stages of shift registers, wherein each of the shift registers includes a first switch, wherein a control terminal of the first switch is configured to receive a first control signal, a first terminal of the first switch is configured to receive the first control signal, and a second terminal of the first switch is electrically coupled to a first node; a second switch, wherein a control terminal of the second switch is electrically coupled to the first node, a first terminal of the second switch is configured to receive a first clock signal, and a second terminal of the second switch is configured to receive a second control signal.

10 Claims, 4 Drawing Sheets

CONTROL CIRCUIT AND DISPLAY PANEL APPLIED BY CONTROL CIRCUIT

FIELD OF INVENTION

The present application relates to the field of display, and especially to a control circuit and a display panel applied by the control circuit.

BACKGROUND OF INVENTION

A liquid crystal display (LCD) is a flat panel display device that uses properties of liquid crystal materials to display pictures. In comparison with other display devices, it has advantages such as light and thin, lower driving voltage, and lower power consumption. Presently, flat panel liquid crystal display driving circuits are mainly manufactured by connecting an integrated circuit (IC) from outside of the panel; however, this approach cannot decrease cost of products, and also cannot make panels thinner.

A liquid crystal display apparatus generally has a gate driving circuit, a source driving circuit, and a pixel array. The pixel array has numerous pixel circuits, each of the pixel circuits turns on and off according to scan signals provided by the gate driving circuit, and displays data pictures according to data signals provided by the source driving circuit. Using a gate driving circuit as an example, a gate driving circuit generally has several stages of shift registers. By an approach of transmitting from one stage of shift register to a next stage shift register, scan signals are output into a pixel array to sequentially turn on pixel circuits such that the pixel circuits receive data signals.

Therefore, during a process of manufacturing driving circuits, gate driving circuits are directly manufactured on array substrates to replace a driving chip manufactured by connecting an exterior IC. This kind of technology is called gate on array (GOA) and can be applied directly around a panel such that manufacturing processes are reduced, cost of products is decreased, and panels are made thinner.

SUMMARY OF INVENTION

In the conventional GOA circuit module, the present application proposes adding a thin film transistor device that can effectively compensate voltage level of a node in a pull-down maintain unit such that a pull-down maintain module can more effectively perform pull-down maintain effect, especially under high temperature conditions, an abnormal output caused by insufficient voltage of nodes can be effectively avoided.

In order to resolve the above-mentioned technical problem, the present application is to provide a control circuit that includes a plurality of stages of shift registers, wherein each of the shift registers includes a first switch, wherein a control terminal of the first switch is configured to receive a first control signal, a first terminal of the first switch is configured to receive the first control signal, and a second terminal of the first switch is electrically coupled to a first node; a second switch, wherein a control terminal of the second switch is electrically coupled to the first node, a first terminal of the second switch is configured to receive a first clock signal, and a second terminal of the second switch is configured to receive a second control signal; and a third switch, wherein a control terminal of the third switch is electrically coupled to a second node, a first terminal of the third switch is configured to receive the second control signal, and a second terminal of the third switch is electrically connected to a first preset low voltage level.

A purpose of the present application and means to resolve the technical problem are realized by adopting the following technical approach.

In an embodiment of the present application, the control circuit further includes a fourth switch, wherein a control terminal of the fourth switch is configured to receive a third control signal, a first terminal of the fourth switch is electrically coupled to the first node, and a second terminal of the fourth switch is electrically connected to a second preset low voltage level.

In an embodiment of the present application, the control circuit further includes a fifth switch, wherein a control terminal of the fifth switch is electrically coupled to the second node, a first terminal of the fifth switch is electrically coupled to the first node, and a second terminal of the fifth switch is electrically connected to the second preset low voltage level.

In an embodiment of the present application, the control circuit further includes a sixth switch, wherein a control terminal of the sixth switch is configured to receive the first clock signal, a first terminal of the sixth switch is configured to receive the first clock signal, and a second terminal of the sixth switch is electrically coupled to a third node.

In an embodiment of the present application, the control circuit further includes a seventh switch, wherein a control terminal of the seventh switch is configured to receive an input signal, a first terminal of the seventh switch is electrically coupled to the third node, and a second terminal of the seventh switch is electrically connected to the second preset low voltage level.

In an embodiment of the present application, the control circuit further includes an eighth switch, wherein a control terminal of the eighth switch is electrically coupled to the third node, a first terminal of the eighth switch is configured to receive the first clock signal, and a second terminal of the eighth switch is electrically coupled to the second node.

In an embodiment of the present application, the control circuit further includes a ninth switch, wherein a control terminal of the ninth switch is configured to receive the input signal, a first terminal of the ninth switch is electrically coupled to the second node, and a second terminal of the ninth switch is electrically connected to the second preset low voltage level.

In an embodiment of the present application, the control circuit further includes a tenth switch, wherein a control terminal of the tenth switch is configured to receive a second clock signal, a first terminal of the tenth switch is configured to receive the second clock signal, and a second terminal of the tenth switch is electrically coupled to the third node.

In an embodiment of the present application, the control circuit further includes a storing capacitor, wherein one terminal of the storing capacitor is electrically coupled to the first node, and another terminal of the storing capacitor is configured to receive the second control signal.

A purpose of the present application and means to resolve the technical problem are further realized by adopting the following technical approach.

The present application is also to provide a display panel that includes a first substrate; and a second substrate disposed facing the first substrate; wherein the display panel further includes a control circuit including a plurality of stages of shift registers, and each of the shift registers includes a first switch, wherein a control terminal of the first switch is configured to receive a first control signal, a first terminal of the first switch is configured to receive the first control signal, and a second terminal of the first switch is electrically coupled to a first node; a second switch, wherein a control terminal of the second switch is electrically coupled to the first node, a first terminal of the second switch is configured to receive a first clock signal, and a second terminal of the second switch is configured to receive a second control signal; a third switch, wherein a control terminal of the third switch is electrically coupled to a second node, a first terminal of the third switch is configured to receive the second control signal, and a second terminal of the third switch is electrically connected to a first preset low voltage level; a fourth switch, wherein a control terminal of the fourth switch is configured to receive a third control signal, a first terminal of the fourth switch is electrically coupled to the first node, and a second terminal of the fourth switch is electrically connected to a second preset low voltage level; a fifth switch, wherein a control terminal of the fifth switch is electrically coupled to the second node, a first terminal of the fifth switch is electrically coupled to the first node, and a second terminal of the fifth switch is electrically connected to the second preset low voltage level; a sixth switch, wherein a control terminal of the sixth switch is configured to receive the first clock signal, a first terminal of the sixth switch is configured to receive the first clock signal, and a second terminal of the sixth switch is electrically coupled to a third node; a seventh switch, wherein a control terminal of the seventh switch is configured to receive an input signal, a first terminal of the seventh switch is electrically coupled to the third node, and a second terminal of the seventh switch is electrically connected to the second preset low voltage level; an eighth switch, wherein a control terminal of the eighth switch is electrically coupled to the third node, a first terminal of the eighth switch is configured to receive the first clock signal, and a second terminal of the eighth switch is electrically coupled to the second node; a ninth switch, wherein a control terminal of the ninth switch is configured to receive the input signal, a first terminal of the ninth switch is electrically coupled to the second node, and a second terminal of the ninth switch is electrically connected to the second preset low voltage level; and a tenth switch, wherein a control terminal of the tenth switch is configured to receive a second clock signal, a first terminal of the tenth switch is configured to receive the second clock signal, and a second terminal of the tenth switch is electrically coupled to the third node.

The present application proposes adding a thin film transistor device that can effectively compensate voltage level of a node in a pull-down maintain unit such that a pull-down maintain module can more effectively perform pull-down maintain effect, especially under high temperature conditions, an abnormal output caused by insufficient voltage of nodes can be effectively avoided.

DESCRIPTION OF DRAWINGS

The accompanying figures to be used in the description of embodiments of the present application will be described in brief to more clearly illustrate the technical solutions of the embodiments. The accompanying figures described below are only part of the embodiments of the present application, from which those skilled in the art can derive further figures without making any inventive efforts.

DETAILED DESCRIPTION OF PREFERRED EMBODIMENTS

Figure 1:
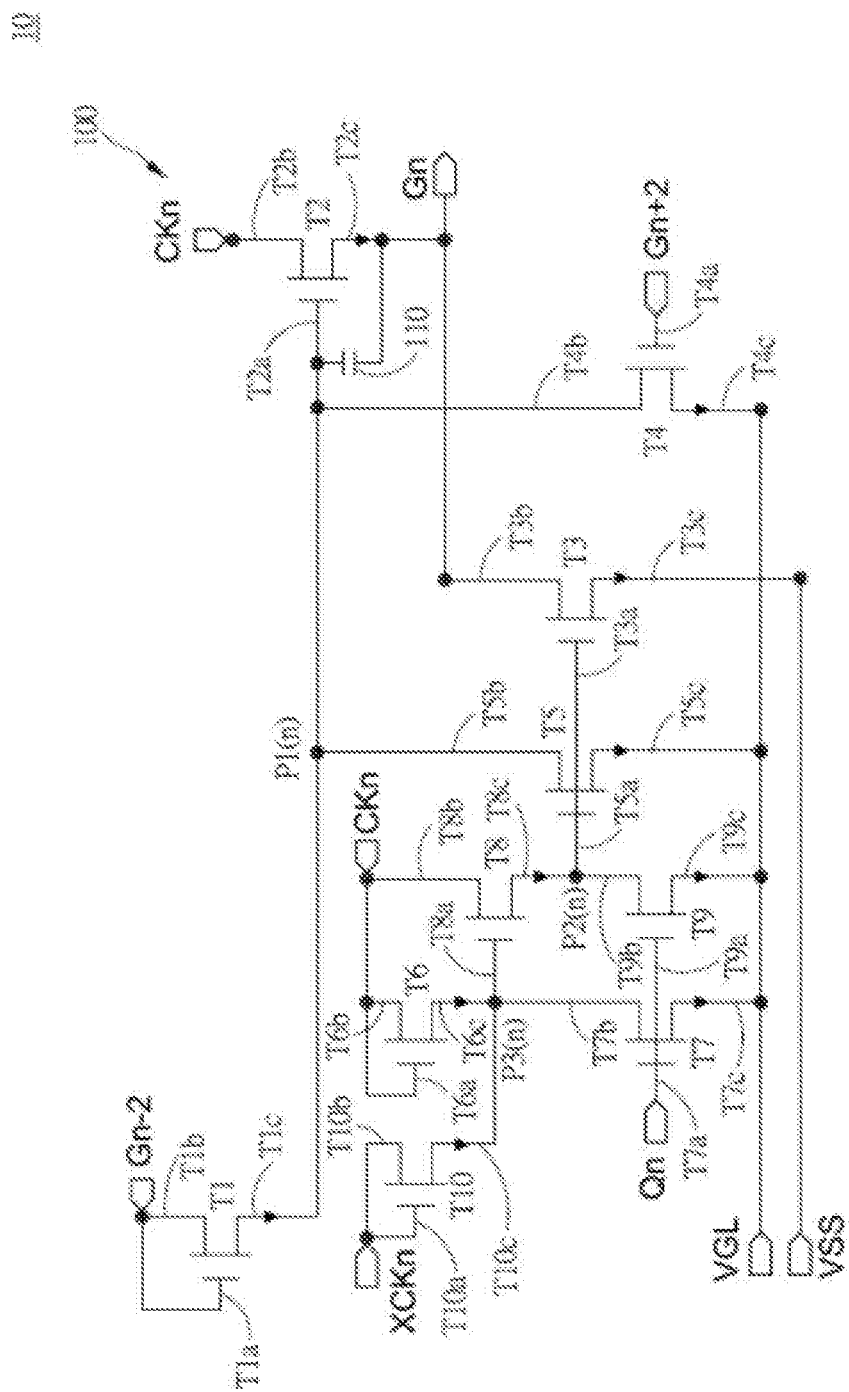
FIG. 1 is a schematic diagram of a control circuit according to an embodiment of the present application.

Referring to accompanying drawings, identical component numerals represent identical components. The following description is based on illustrative embodiments of the present application and should not be regarded as limiting other embodiments of the present application that are not described in detail here.

Description of the following embodiments with reference to accompanying drawings illustrates specific embodiments of the present application. Directional terms mentioned in the present application such as "upper", "lower", "front", "rear", "left", "right", "inside", "outside", "side", etc. are simply with respect to a direction of the accompanying drawings. Therefore, directional terms used are for explanation and understanding of the present application and do not limit the present application.

In the accompanying drawings, for the sake of clarity, thicknesses of layers, films, panels, areas, etc. are exaggerated. In the accompanying drawings, for the sake of understanding and easier description, thicknesses of layers and areas are exaggerated. It should be understood that when components such as layers, films, areas, or bases are said to be "on" another component, the components can be directly on the other component, or there can be intermediate components.

Drawings and description are regarded as illustrative and not limited. In the drawings, units with similar structures are represented by identical numerals. Furthermore, for the sake of understanding and easier description, sizes and thicknesses of each of components illustrated in the accompanying drawings are arbitrary and the present application is not limited thereto.

Furthermore, in the specification, unless clearly described as opposite, the term "include" will be understood to mean including the component while not excluding any other components. In addition, in the specification, "on" means on or below a target component and does not necessarily mean on top of something based on a gravity direction.

For further describing a technical approach and effects adopted to achieve a purpose of the present invention, the following with reference to the accompanying drawings and embodiments describes in detail embodiments, structures, features, and the effects of a control circuit and a display panel applied by the control circuit according to the present application.

FIG. 1 is a schematic diagram of a control circuit according to an embodiment of the present application. Referring to FIG. 1, in an embodiment of the present application, a control circuit 100 includes a plurality of stages of shift registers, wherein each of the shift registers includes a first switch T1, wherein a control terminal T1a of the first switch T1 is configured to receive a first control signal Gn−2, a first terminal T1b of the first switch T1 is configured to receive the first control signal Gn−2, and a second terminal T1c of the first switch T1 is electrically coupled to a first node P1(n); a second switch T2, wherein a control terminal T2a of the second switch T2 is electrically coupled to the first node P1(n), a first terminal T2b of the second switch T2 is configured to receive a first clock signal CKn, and a second terminal T2c of the second switch T2 is configured to receive a second control signal Gn; and a third switch T3, wherein a control terminal T3a of the third switch T3 is electrically coupled to a second node P2(n), a first terminal T3b of the third switch T3 is configured to receive the second control signal Gn, and a second terminal T3c of the third switch T3 is electrically connected to a first preset low voltage level VSS.

In an embodiment of the present application, the control circuit 100 further includes a fourth switch T4, wherein a control terminal T4a of the fourth switch T4 is configured to receive a third control signal Gn+2, a first terminal T4b of the fourth switch T4 is electrically coupled to the first node P1(n), and a second terminal T4c of the fourth switch T4 is electrically connected to a second preset low voltage level VGL.

In an embodiment of the present application, the control circuit 100 further includes a fifth switch T5, wherein a control terminal T5a of the fifth switch T5 is electrically coupled to the second node P2(n), a first terminal T5b of the fifth switch T5 is electrically coupled to the first node P1(n), and a second terminal T5c of the fifth switch T5 is electrically connected to the second preset low voltage level VGL.

In an embodiment of the present application, the control circuit 100 further includes a sixth switch T6, wherein a control terminal T6a of the sixth switch T6 is configured to receive the first clock signal CKn, a first terminal T6b of the sixth switch T6 is configured to receive the first clock signal CKn, and a second terminal T6c of the sixth switch T6 is electrically coupled to a third node P3(n).

In an embodiment of the present application, the control circuit 100 further includes a seventh switch T7, wherein a control terminal T7a of the seventh switch T7 is configured to receive an input signal Qn, a first terminal T7b of the seventh switch T7 is electrically coupled to the third node P3(n), and a second terminal T7c of the seventh switch T7 is electrically connected to the second preset low voltage level VGL.

In an embodiment of the present application, the control circuit 100 further includes an eighth switch T8, wherein a control terminal T8a of the eighth switch T8 is electrically coupled to the third node P3(n), a first terminal T8b of the eighth switch T8 is configured to receive the first clock signal CKn, and a second terminal T8c of the eighth switch T8 is electrically coupled to the second node P2(n).

In an embodiment of the present application, the control circuit 100 further includes a ninth switch T9, wherein a control terminal T9a of the ninth switch T9 is configured to receive the input signal Qn, a first terminal T9b of the ninth switch T9 is electrically coupled to the second node P2(n), and a second terminal T9c of the ninth switch T9 is electrically connected to the second preset low voltage level VGL.

In an embodiment of the present application, the control circuit 100 further includes a tenth switch T10, wherein a control terminal T10a of the tenth switch T10 is configured to receive a second clock signal XCKn, a first terminal T10b of the tenth switch T10 is configured to receive the second clock signal XCKn, and a second terminal T10c of the tenth switch T10 is electrically coupled to the third node P3(n).

In an embodiment of the present application, the control circuit 100 further includes a storing capacitor 110, wherein one terminal of the storing capacitor 110 is electrically coupled to the first node P1(n), and another terminal of the storing capacitor 110 is configured to receive the second control signal Gn.

Referring to FIG. 1, in an embodiment of the present application, a display panel 10 includes a first substrate (not shown); and a second substrate (not shown) disposed facing the first substrate. The display panel 10 further includes a control circuit 100 that includes a plurality of stages of shift registers, wherein each of the shift registers includes a first switch T1, wherein a control terminal T1a of the first switch T1 is configured to receive a first control signal Gn−2, a first terminal T1b of the first switch T1 is configured to receive the first control signal Gn−2, and a second terminal T1c of the first switch T1 is electrically coupled to a first node P1(n), a second switch T2, wherein a control terminal T2a of the second switch T2 is electrically coupled to the first node P1(n), a first terminal T2b of the second switch T2 is configured to receive a first clock signal CKn, and a second terminal T2c of the second switch T2 is configured to receive a second control signal Gn; a third switch T3, wherein a control terminal T3a of the third switch T3 is electrically coupled to a second node P2(n), a first terminal T3b of the third switch T3 is configured to receive the second control signal Gn, and a second terminal T3c of the third switch T3 is electrically connected to a first preset low voltage level VSS; a fourth switch T4, wherein a control terminal T4a of the fourth switch T4 is configured to receive a third control signal Gn+2, a first terminal T4b of the fourth switch T4 is electrically coupled to the first node P1(n), and a second terminal T4c of the fourth switch T4 is electrically connected to a second preset low voltage level VGL; a fifth switch T5, wherein a control terminal T5a of the fifth switch T5 is electrically coupled to the second node P2(n), a first terminal T5b of the fifth switch T5 is electrically coupled to the first node P1(n), and a second terminal T5c of the fifth switch T5 is electrically connected to the second preset low voltage level VGL; a sixth switch T6, wherein a control terminal T6a of the sixth switch T6 is configured to receive the first clock signal CKn, a first terminal T6b of the sixth switch T6 is configured to receive the first clock signal CKn, and a second terminal T6c of the sixth switch T6 is electrically coupled to a third node P3(n); a seventh switch T7, wherein a control terminal T7a of the seventh switch T7 is configured to receive an input signal Qn, a first terminal T7b of the seventh switch T7 is electrically coupled to the third node P3(n), and a second terminal T7c of the seventh switch T7 is electrically connected to the second preset low voltage level VGL; an eighth switch T8, wherein a control terminal T8a of the eighth switch T8 is electrically coupled to the third node P3(n), a first terminal T8b of the eighth switch T8 is configured to receive the first clock signal CKn, and a second terminal T8c of the eighth switch T8 is electrically coupled to the second node P2(n); a ninth switch T9, wherein a control terminal T9a of the ninth switch T9 is configured to receive the input signal Qn, a first terminal T9b of the ninth switch T9 is electrically coupled to the second node P2(n), and a second terminal T9c of the ninth switch T9 is electrically connected to the second preset low voltage level VGL; a tenth switch T10, wherein a control terminal T10a of the tenth switch T10 is configured to receive a second clock signal XCKn, a first terminal T10b of the tenth switch T10 is configured to receive the second clock signal XCKn, and a second terminal T10c of the tenth switch T10 is electrically coupled to the third node P3(n); and a storing capacitor 110, wherein one terminal of the storing capacitor 110 is electrically coupled to the first node P1(n), and other terminal of the storing capacitor 110 is configured to receive the second control signal Gn.

Referring to FIG. 1, in an embodiment of the present application, in the convention gate on array (GOA) circuit, a thin film transistor T10 controlled by XCKn is added in a pull-down unit module (T3, T4, T5, T6, T7, T8, T9). When CKn is at a low voltage level, T6 is turned off, and at this time P3(n) and P2(n) nodes are floating. When XCKn is at a high voltage level, P3(n) is at a high voltage level, T7 is turned on to pull down P2(n) node to CKn's low voltage level (−15V), and at this time thin film transistors T3 and T5 are completely turned off.

Figure 2:
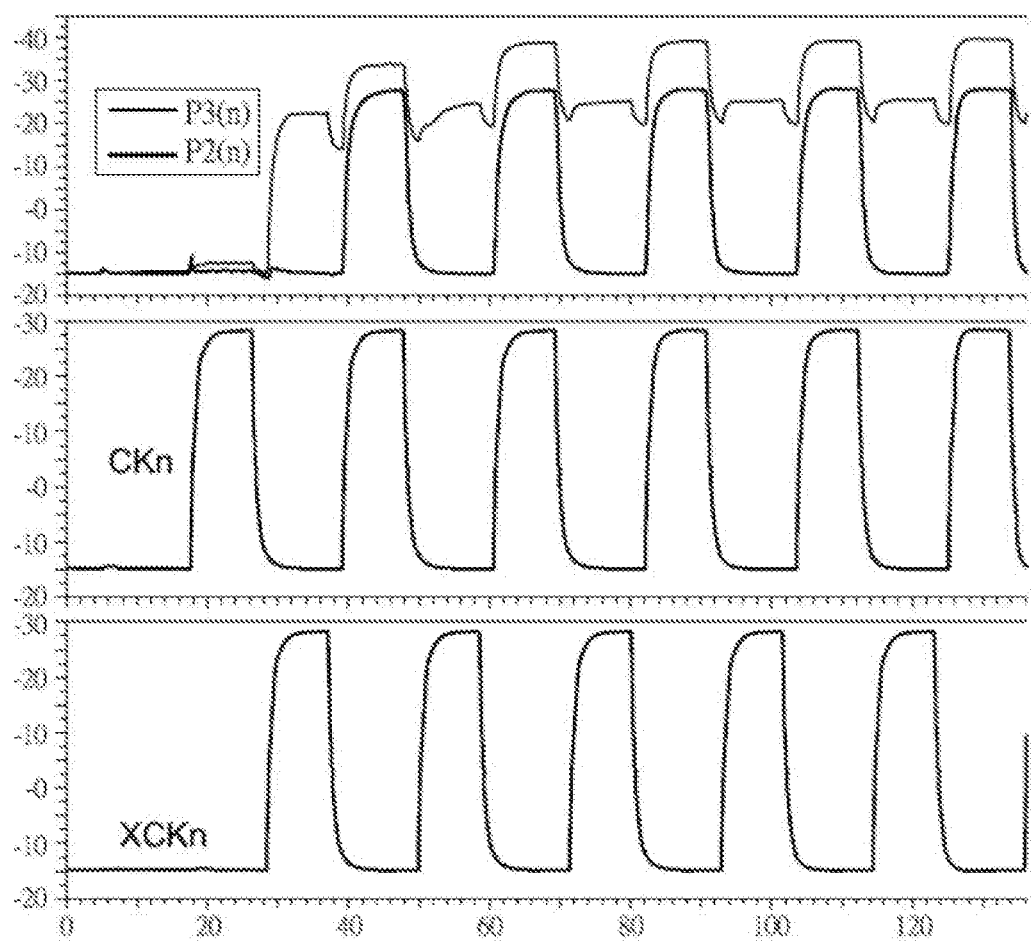
FIG. 2 is a schematic diagram of waveforms output by a control circuit according to an embodiment of the present application.

FIG. 2 is a schematic diagram of waveforms output by a control circuit 100 according to an embodiment of the present application. Referring to FIG. 1 and FIG. 2, in an embodiment of the present application, waveforms of nodes P3(n) and P2(n) in a new GOA circuit module. When CKn is at a high voltage level, highest value of node P3(n)'s high voltage level is about 39 volts, and node P2(n)'s high voltage level is about 28 volts. In comparison with the conventional circuits, these voltage levels can more effectively turn on thin film transistors T8, T3, and T5 such that Qn and Gn can more effectively maintain at voltage levels of VGL and VSS.

Figure 3:
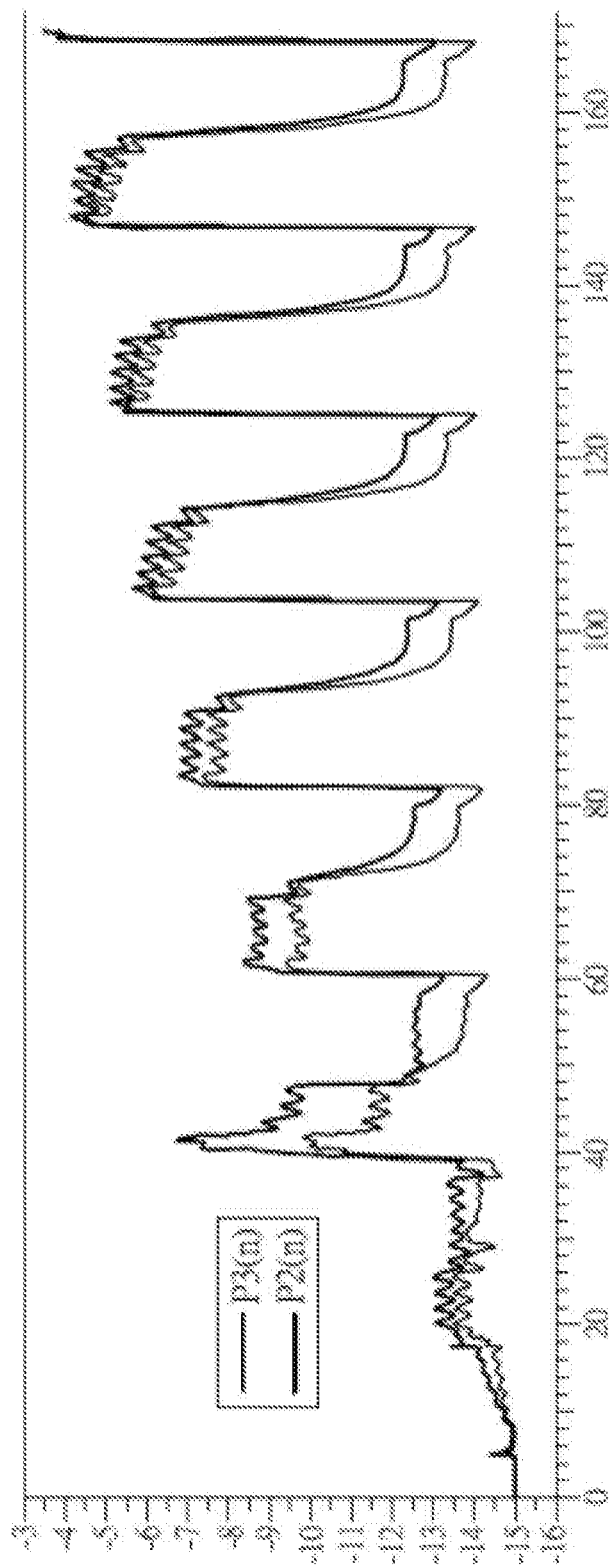
FIG. 3 is a schematic diagram of waveforms output by a conventional control circuit when temperature is 160 degrees.

FIG. 3 is a schematic diagram of waveforms output by a conventional control circuit when temperature is 160 degrees. Referring to FIG. 3, in the conventional circuit, under a high temperature condition (160 Celsius degrees), voltage values of nodes P3(n) and P2(n) are both lower than 0 volt such that Qn and Gn cannot be effectively pulled down to voltage levels of VGL and VSS, which leads to a multi-pulse condition at gate's waveform output by the GOA such that abnormal pictures occur.

Figure 4:
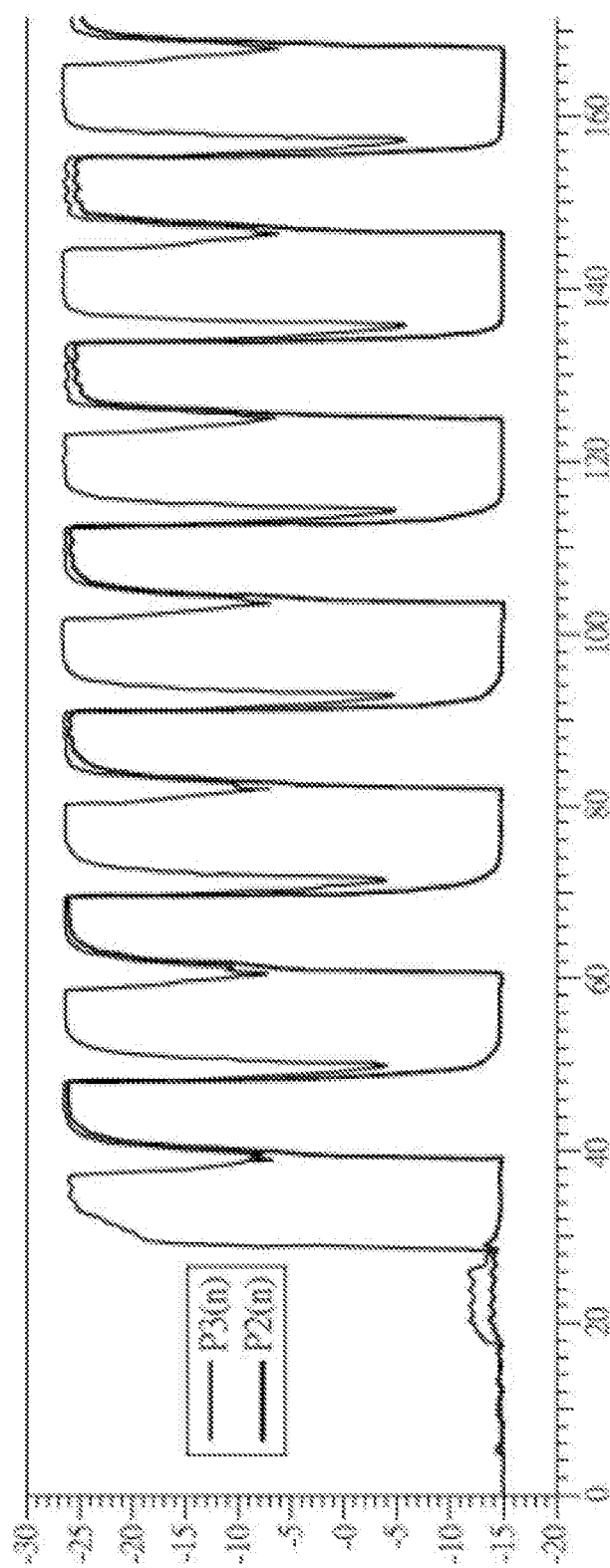
FIG. 4 is a schematic diagram of waveforms output by a control circuit according to an embodiment of the present application when temperature is 160 degrees.

FIG. 4 is a schematic diagram of waveforms output by a control circuit according to an embodiment of the present application when temperature is 160 degrees. Referring to FIG. 1 and FIG. 4, in a new GOA circuit, under a high temperature condition (160 Celsius degrees), a high voltage value of nodes P3(n) and P2(n) is about 28 volts, which can still effectively perform a pull-down maintain effect.

The present application proposes adding a thin film transistor device that can effectively compensate voltage level of a node in a pull-down maintain unit such that a pull-down maintain module can more effectively perform a pull-down maintain effect, especially under high temperature conditions, an abnormal output caused by insufficient voltage of nodes can be effectively avoided.

Although the present invention has been explained in relation to its preferred embodiment, it does not intend to limit the present invention. It is obvious to those skilled in the art having regard to this present invention that other modifications of the exemplary embodiments beyond these embodiments specifically described here may be made without departing from the spirit of the invention. Accordingly, such modifications are considered within the scope of the invention as limited solely by the appended claims.

Subject of the present application can be made and used in industries and has industrial utility.

What is claimed is:

1. A control circuit, comprising a plurality of stages of shift registers, wherein each of the shift registers comprises:
a first switch, wherein a control terminal of the first switch is configured to receive a first control signal, a first terminal of the first switch is configured to receive the first control signal, and a second terminal of the first switch is electrically coupled to a first node;
a second switch, wherein a control terminal of the second switch is electrically coupled to the first node, a first terminal of the second switch is configured to receive a first clock signal, and a second terminal of the second switch is configured to receive a second control signal; and
a third switch, wherein a control terminal of the third switch is electrically coupled to a second node, a first terminal of the third switch is configured to receive the second control signal, and a second terminal of the third switch is electrically connected to a first preset low voltage level.

2. The control circuit as claimed in claim 1, comprising a fourth switch, wherein a control terminal of the fourth switch is configured to receive a third control signal, a first terminal of the fourth switch is electrically coupled to the first node, and a second terminal of the fourth switch is electrically connected to a second preset low voltage level.

3. The control circuit as claimed in claim 2, comprising a fifth switch, wherein a control terminal of the fifth switch is electrically coupled to the second node, a first terminal of the fifth switch is electrically coupled to the first node, and a second terminal of the fifth switch is electrically connected to the second preset low voltage level.

4. The control circuit as claimed in claim 2, comprising a sixth switch, wherein a control terminal of the sixth switch is configured to receive the first clock signal, a first terminal of the sixth switch is configured to receive the first clock signal, and a second terminal of the sixth switch is electrically coupled to a third node.

5. The control circuit as claimed in claim 4, comprising a seventh switch, wherein a control terminal of the seventh switch is configured to receive an input signal, a first terminal of the seventh switch is electrically coupled to the third node, and a second terminal of the seventh switch is electrically connected to the second preset low voltage level.

6. The control circuit as claimed in claim 4, comprising an eighth switch, wherein a control terminal of the eighth switch is electrically coupled to the third node, a first terminal of the eighth switch is configured to receive the first clock signal, and a second terminal of the eighth switch is electrically coupled to the second node.

7. The control circuit as claimed in claim 5, comprising a ninth switch, wherein a control terminal of the ninth switch is configured to receive the input signal, a first terminal of the ninth switch is electrically coupled to the second node, and a second terminal of the ninth switch is electrically connected to the second preset low voltage level.

8. The control circuit as claimed in claim 4, comprising a tenth switch, wherein a control terminal of the tenth switch is configured to receive a second clock signal, a first terminal of the tenth switch is configured to receive the second clock signal, and a second terminal of the tenth switch is electrically coupled to the third node.

9. The control circuit as claimed in claim 1, comprising a storing capacitor, wherein one terminal of the storing capacitor is electrically coupled to the first node, and another terminal of the storing capacitor is configured to receive the second control signal.

10. A display panel, comprising:
a first substrate; and
a second substrate disposed facing the first substrate;
wherein the display panel comprises a control circuit comprising a plurality of stages of shift registers, and each of the shift registers comprises:
a first switch, wherein a control terminal of the first switch is configured to receive a first control signal, a first terminal of the first switch is configured to receive the first control signal, and a second terminal of the first switch is electrically coupled to a first node;

a second switch, wherein a control terminal of the second switch is electrically coupled to the first node, a first terminal of the second switch is configured to receive a first clock signal, and a second terminal of the second switch is configured to receive a second control signal;

a third switch, wherein a control terminal of the third switch is electrically coupled to a second node, a first terminal of the third switch is configured to receive the second control signal, and a second terminal of the third switch is electrically connected to a first preset low voltage level;

a fourth switch, wherein a control terminal of the fourth switch is configured to receive a third control signal, a first terminal of the fourth switch is electrically coupled to the first node, and a second terminal of the fourth switch is electrically connected to a second preset low voltage level;

a fifth switch, wherein a control terminal of the fifth switch is electrically coupled to the second node, a first terminal of the fifth switch is electrically coupled to the first node, and a second terminal of the fifth switch is electrically connected to the second preset low voltage level;

a sixth switch, wherein a control terminal of the sixth switch is configured to receive the first clock signal, a first terminal of the sixth switch is configured to receive the first clock signal, and a second terminal of the sixth switch is electrically coupled to a third node;

a seventh switch, wherein a control terminal of the seventh switch is configured to receive an input signal, a first terminal of the seventh switch is electrically coupled to the third node, and a second terminal of the seventh switch is electrically connected to the second preset low voltage level;

an eighth switch, wherein a control terminal of the eighth switch is electrically coupled to the third node, a first terminal of the eighth switch is configured to receive the first clock signal, and a second terminal of the eighth switch is electrically coupled to the second node;

a ninth switch, wherein a control terminal of the ninth switch is configured to receive the input signal, a first terminal of the ninth switch is electrically coupled to the second node, and a second terminal of the ninth switch is electrically connected to the second preset low voltage level; and a tenth switch, wherein a control terminal of the tenth switch is configured to receive a second clock signal, a first terminal of the tenth switch is configured to receive the second clock signal, and a second terminal of the tenth switch is electrically coupled to the third node.

* * * * *